(12) United States Patent  
Morgan

(10) Patent No.: US 7,963,776 B1
(45) Date of Patent: Jun. 21, 2011

(54) ELECTRICAL CONNECTOR ASSEMBLY HAVING DIRECT CONNECTION TERMINALS

(75) Inventor: Chad William Morgan, Woolwich Township, NJ (US)

(73) Assignee: Tyco Electronics Corporation, Berwyn, PA (US)

( * ) Notice: Subject to any disclaimer, the term of this patent is extended or adjusted under 35 U.S.C. 154(b) by 0 days.

(21) Appl. No.: 12/730,004

(22) Filed: Mar. 23, 2010

(51) Int. Cl.
*H01R 9/09* (2006.01)

(52) U.S. Cl. ............ 439/75; 439/82; 174/266; 174/267; 174/262

(58) Field of Classification Search ............... 439/75, 439/751, 82, 746–749; 174/266, 267, 262
See application file for complete search history.

(56) References Cited

U.S. PATENT DOCUMENTS

| | | | |
|---|---|---|---|
| 2,958,064 A * | 10/1960 | Swengel | 439/85 |
| 4,906,198 A * | 3/1990 | Cosimano et al. | 439/82 |
| 5,038,252 A * | 8/1991 | Johnson | 361/792 |
| 5,543,586 A | 8/1996 | Crane, Jr. et al. | |
| 5,823,830 A * | 10/1998 | Wurster | 439/751 |
| 6,181,219 B1 * | 1/2001 | Gailus et al. | 333/33 |
| 6,663,442 B1 * | 12/2003 | Helster et al. | 439/751 |
| 7,155,821 B1 * | 1/2007 | Downes et al. | 29/852 |
| 7,540,744 B1 * | 6/2009 | Minich | 439/65 |
| 2007/0169661 A1 | 7/2007 | Kwong et al. | |
| 2008/0207015 A1 | 8/2008 | Sueyoshi | |

* cited by examiner

*Primary Examiner* — Gary F. Paumen

(57) ABSTRACT

An electrical connector assembly includes a circuit board having vias extending at least partially through the circuit board along via axes. The circuit board has traces and mounting pads that are electrically connected to corresponding traces, and that are exposed within corresponding vias. The vias have a staged diameter along the via axis with a constricted region proximate to the mounting. An electrical connector is mounted on the circuit board. The electrical connector includes a housing and signal terminals held by the housing. The signal terminals include mounting contacts being received in respective vias of the circuit board that engage corresponding mounting pads in the constricted region.

21 Claims, 4 Drawing Sheets

ELECTRICAL CONNECTOR ASSEMBLY HAVING DIRECT CONNECTION TERMINALS

BACKGROUND OF THE INVENTION

The subject matter described and/or illustrated herein relates generally to electrical connector systems and, more particularly, to electrical connectors that are mounted on circuit boards.

To meet digital multi-media demands, higher data throughput is often desired for current digital communications equipment. Electrical connectors that interconnect circuit boards must therefore handle ever increasing signal speeds at ever increasing signal densities. One application environment that uses such electrical connectors is in high speed, differential electrical connectors, such as those common in the telecommunications or computing environments. In a traditional approach, two circuit boards are interconnected with one another in a backplane and a daughter board configuration. However, at the footprints of the circuit boards where the electrical connectors connect thereto it may be difficult to improve density while maintaining electrical performance and/or reasonable manufacturing cost. For example, in known circuit boards, vias within the circuit boards are plated, creating plated through holes (PTHs) that are electrically connected to corresponding traces in the circuit board. Contacts extending from the electrical connectors are connected to the PTHs, and thus the traces, using eye-of-the-needle contacts. However, the PTHs create electrical problems, such as low impedance and high cross-talk through the circuit board. One method of improving such footprints is to counterbore a portion(s) of the PTHs to remove the plating to an area just in the vicinity of the corresponding trace in the circuit board. However, the same problems still remain in the short length of the non-bored PTHs that remain for interfacing the contacts with the traces. Such region, though short, still has low impedance, which becomes increasingly problematic at higher transmission speeds.

At least some known systems have attempted to eliminate the plating entirely in the vias, having the contacts connect directly to the traces. However, such systems are not without disadvantages. For instance, there are significant stresses placed on the contacts as the contacts are inserted into the vias, resulting in contact wear and/or buckling of the contact. To overcome such problems, the contacts are made larger, which may cause additional signal degradation problems. Additionally, such systems utilize contacts that are relatively short, which limits such systems to circuit boards that are relatively thin, or restrict connection to an upper layer of the circuit board.

To achieve higher system densities and speed, further improvement of circuit board footprints and connections to the circuit boards must be made over known approaches. There is a need for an electrical connector that enables improvement of the density and/or electrical performance of circuit board footprints to achieve higher system densities and/or higher system speeds.

BRIEF DESCRIPTION OF THE INVENTION

In one embodiment, an electrical connector assembly is provided that includes a circuit board having vias extending at least partially through the circuit board along via axes. The circuit board has traces and mounting pads that are electrically connected to corresponding traces, and that are exposed within corresponding vias. The vias have a smaller diameter portion proximate to the mounting pad. An electrical connector is mounted on the circuit board. The electrical connector includes a housing and signal terminals held by the housing. The signal terminals include mounting contacts being received in respective vias of the circuit board that engage corresponding mounting pads in the constricted region of the via.

In another embodiment, an electrical connector assembly is provided including a circuit board having vias extending at least partially through the circuit board along parallel via axes. The circuit board has mounting pads being electrically connected to corresponding traces routed through the circuit board that are exposed within corresponding vias. The vias have a smaller diameter portion proximate to the mounting pad and the vias having an upper larger diameter portion and a lower larger diameter portion above and below the smaller diameter portion, respectively. An upper shoulder is defined between the upper larger diameter portion and the smaller diameter portion and a lower shoulder is defined between the lower larger diameter portion and the smaller diameter portion. An electrical connector is mounted on the circuit board. The electrical connector includes a housing and signal terminals held by the housing. The signal terminals include mounting contacts being received in respective vias of the circuit board that engage the corresponding mounting pads. The mounting contacts have a retention barb engaging the lower shoulder to hold the mounting contact within the corresponding via.

In a further embodiment, an electrical connector is provided for mounting on a circuit board having vias with mounting pads exposed within corresponding vias. The electrical connector includes a housing having a mounting face configured to be mounted along the circuit board, and signal terminals held by the housing. The signal terminals are configured to extend into respective vias of the circuit board and include mounting contacts extending outward from the mounting face of the housing. The mounting contacts are configured to engage corresponding mounting pads in the vias and have retention barbs extending outward therefrom that are configured to engage the vias to hold the mounting contacts within the corresponding vias.

DETAILED DESCRIPTION OF THE INVENTION

Figure 1:
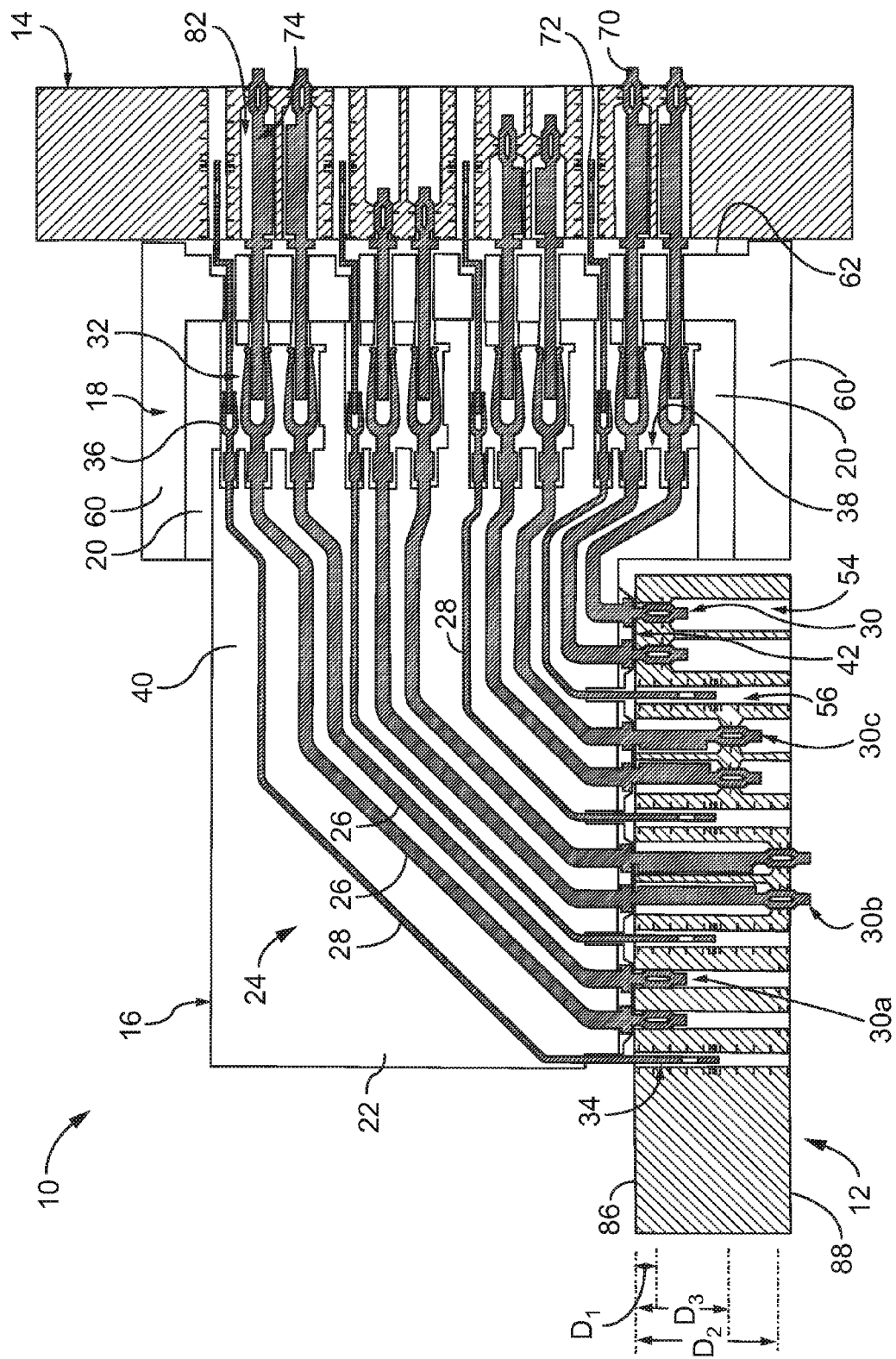
FIG. 1 is a cross-sectional view of an exemplary embodiment of an electrical connector assembly illustrating electrical connectors mounted to circuit boards.

FIG. 1 is a cross-sectional view of an exemplary embodiment of an electrical connector assembly 10. The connector assembly 10 includes a pair of circuit boards 12 and 14, a receptacle connector 16, and a header connector 18. The receptacle connector 16 is mounted on the circuit board 12, and the header connector 18 is mounted on the circuit board 14. The receptacle connector 16 and the header connector 18 are connected together to electrically connect the circuit boards 12 and 14. In the exemplary embodiment of FIG. 1, the receptacle connector 16 and the header connector 18 are oriented such that the connectors 16 and 18 form an approximate right-angle connection between the circuit boards 12 and 14. Alternatively, the receptacle connector 16 and the header connector 18 may be oriented such that the circuit boards 12 and 14 are oriented at any other angle relative to each other, such as, but not limited to, approximately parallel.

The receptacle connector 16 includes a dielectric housing 20 that, in the illustrated embodiment, holds a plurality of parallel contact modules 22 (one of which is illustrated in FIG. 1). The contact module 22 includes a contact lead frame 24 that includes a plurality of signal terminals 26 and a plurality of ground terminals 28. Each signal terminal 26 includes a mounting contact 30 at one end portion of the signal terminal 26 and a mating contact 32 at an opposite end portion of the signal terminal 26. In the illustrated embodiment, the mounting contacts 30 represent eye-of-the-needle type contacts for interference mounting to corresponding mounting pads 102 of the circuit board 12.

Similarly, each ground terminal 28 includes a mounting contact 34 at one end portion of the ground terminal 28 and a mating contact 36 at an opposite end portion of the ground terminal 28. The mounting contacts 34 may be similar to the mounting contacts 30 (e.g. eye-of-the-needle type contacts), or the mounting contacts 34 may be a different type of contact, such as a pin or a spring contact. The mating contacts 32 and 36 extend outward from, and along, a mating face 38 of the contact module 22. The signal terminals 26 are optionally arranged in differential pairs.

Each contact module 22 includes a dielectric contact module housing 40 that holds the corresponding lead frame 24. Each contact module housing 40 includes the mating face 38 and a mounting face 42. In the illustrated embodiment, the mating face 38 is approximately perpendicular to the mounting face 42. However, the mating face 38 and mounting face 42 may be oriented at any other angle relative to each other, such as, but not limited to, approximately parallel. The mating face 38 of each contact module is received in the housing 20 and is configured to mate with corresponding mating contacts of the header connector 18.

The mounting face 42 of each of the contact modules 22 is configured for mounting on a circuit board, such as, but not limited to, the circuit board 12. The mounting contacts 30 and 34 extend outward from, and along, the mounting face 42 of the contact modules 22 for mechanical and electrical connection to the circuit board 12. Specifically, each of the mounting contacts 30 and 34 is configured to be received within a corresponding via 54 and 56, respectively, within the circuit board 12. In an exemplary embodiment, the vias 54 are staged or stepped being defined by regions having different cross-sectional shapes and/or sizes along a length of the via 54.

In an exemplary embodiment, the signal terminals 26 constitute variable depth connection terminals, where some of the mounting contacts 30 extend different lengths from the mounting face 42 than others of the mounting contacts 30 (whether the others are on the same contact module 22 or a different contact module 22) to different mating depths. In the illustrated embodiment, a differential pair 30a of the mounting contacts 30 extends to a mating depth $D_1$ from the mounting face 42, a differential pair 30b of the mounting contacts 30 extends to a mating depth $D_2$ from the mounting face 42, and a differential pair 30c of the mounting contacts 30 extends to a mating depth $D_3$ from the mounting face 42. The depths $D_1$-$D_3$ are each different. Any of the mounting contacts 30 of the receptacle connector 16 may have a different length, and thus a different mating depth, from the corresponding mounting face 42 than any other mounting contact 30 of the receptacle connector 16. The pattern of the lengths of the mounting contacts 30 shown herein is meant as exemplary only.

The header connector 18 includes a dielectric housing 60 that receives the receptacle connector 16 and a mounting face 62 for mounting the header connector 18 to a circuit board, such as, but not limited to, the circuit board 14. The housing 60 holds a plurality of signal terminals 70 and a plurality of ground terminals 72. The signal terminals 70 are optionally arranged in differential pairs, as the signal terminals 70 are shown in the illustrated embodiment.

Each signal terminal 70 includes a mounting contact 74 at one end portion of the signal terminal 70. Each of the mounting contacts 74 is configured to be received within a corresponding via 82 within the circuit board 14. Similar to the mounting contacts 30 of the receptacle connector 16, some of the mounting contacts 74 of the signal terminals 70 extend different lengths from the mounting face 62 of the header connector 18 than others of the mounting contacts 74. The mounting contacts 74 may be similar to the mounting contacts 30.

The circuit board 12 includes a pair of opposite upper and lower surfaces 86, 88. The mounting face 42 of each of the contact modules 22 is configured to be mounted along the upper surface 86 such that the receptacle connector 16 is mounted on the upper surface 86 of the circuit board 12. The circuit board 12 includes the plurality of vias 54, 56 that receive the mounting contacts 30 and 34, respectively, of the respective signal and ground terminals 26 and 28. The circuit board 14 may be formed in a similar manner as the circuit board 12.

Figure 2:
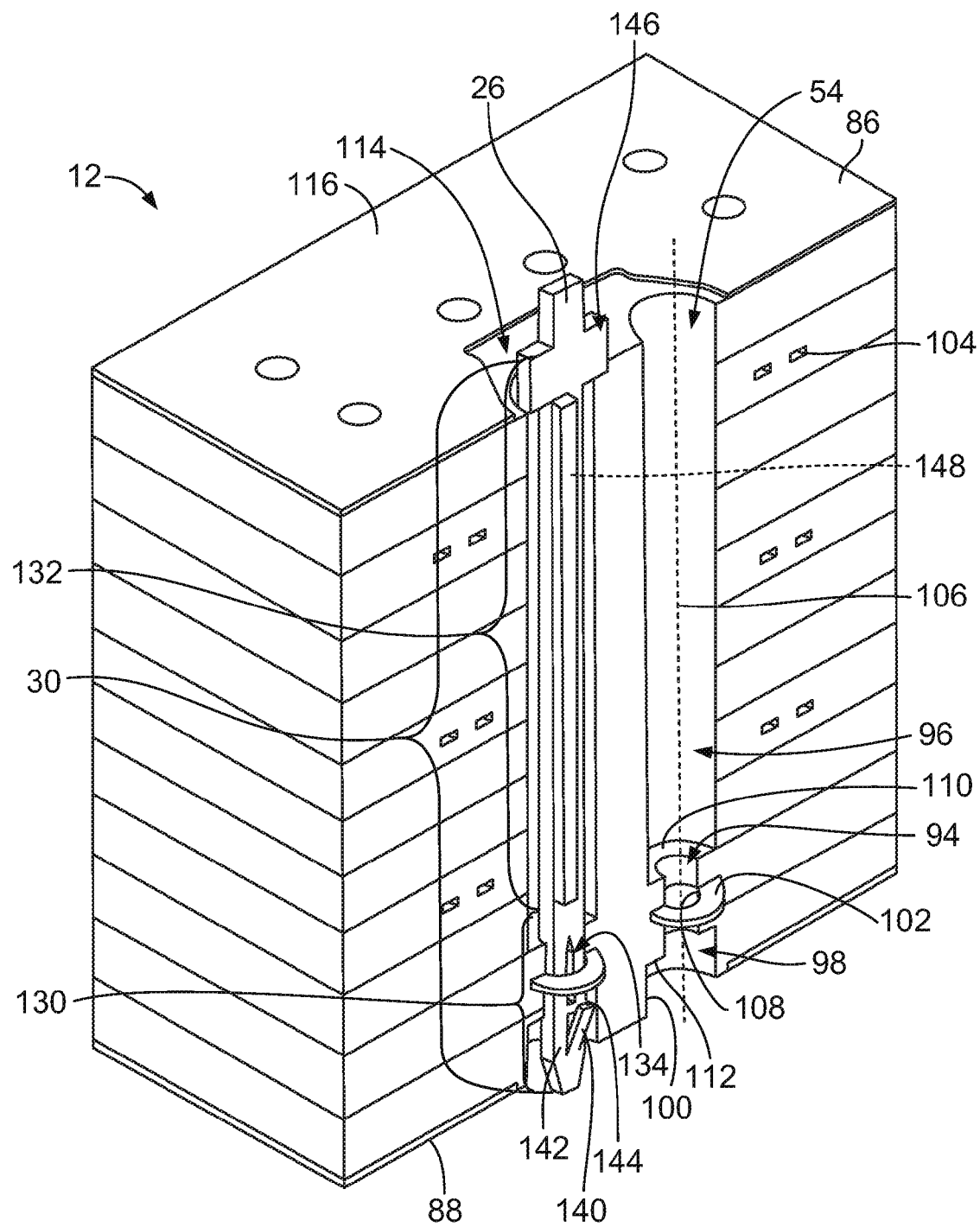
FIG. 2 is a partial cut-away view of the circuit board shown in FIG. 1 illustrating signal terminals mounted to the circuit board.
Figure 3:
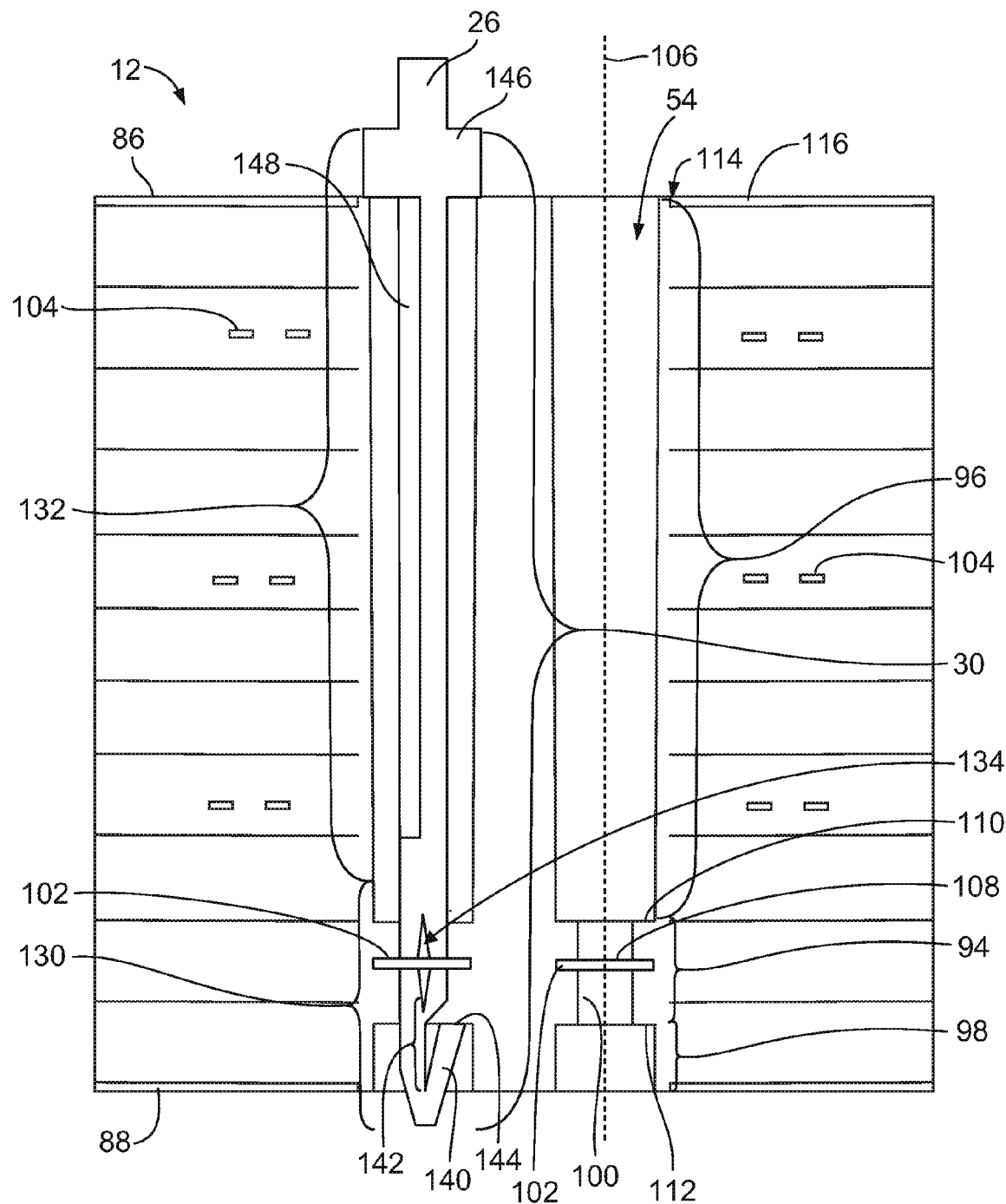
FIG. 3 is a side view of the circuit board and signal terminals shown in FIG. 2.

FIG. 2 is a partial cut-away view of the circuit board 12 illustrating a signal terminal 26 connected to the circuit board 12 in a corresponding via 54. FIG. 3 is a side view of the circuit board 12 and signal terminal 26. The mounting contact 30 of the signal terminal 26 is the only portion of the signal terminal 26 illustrated in FIGS. 2 and 3. FIGS. 2 and 3 also illustrate one of the vias 54 with the corresponding signal terminal 26 removed for clarity. In an exemplary embodiment, when the receptacle connector 16 (shown in FIG. 1) is mounted to the circuit board 12, each of the signal terminals 26 is simultaneously loaded into a corresponding one of the vias 54.

The vias 54 extend through the layers of the circuit board 12 between the upper and lower surfaces 86, 88. The thickness of the circuit board 12 is a function of the number of layers, and the number of layers may depend, at least in part, on the number of components being connected to the circuit board 12. For example, a backplane circuit board may be substantially thicker than a daughtercard circuit board because many more electrical components are connected to the backplane circuit board as compared to the daughtercard circuit board, thus more layers are required to route the traces through the board.

The vias 54 are staged along a length thereof to include a smaller diameter portion 94 and one or more larger diameter portions 96, 98. The smaller diameter portion 94 constitutes a constricted region, and may be referred to hereinafter as constricted region 94. The larger diameter portion 96 is arranged above the constricted region 94, and may be referred to as an upper larger diameter portion 96 or an upper via 96. The larger diameter portion 98 is arranged below the constricted region 94, and may be referred to as a lower larger diameter portion or a lower via 98. Optionally, the vias 54 may be stepped between the constricted region 94 and the upper and lower vias 96, 98. Any number of steps or stages may be provided.

Optionally, the vias 54 may include only one of the larger diameter portions 96, 98 and not the other.

Each via 54 includes a via wall 100 defining the via 54. The via wall 100 is stepped inward in the vicinity of the mounting pad 102 to define the constricted region 94. The mounting pad 102 is electrically connected to, and forms part of, a corresponding trace 104 routed through the circuit board 12. The mounting pad 102 is arranged at a depth from the upper surface 86, such that the mounting pad 102 is internal to the circuit board, as opposed to being a surface mounting pad on the upper surface 86. The mounting pad 102 is provided in, or on, a particular layer of the circuit board 12 that also includes at least a portion of the corresponding trace 104. Optionally, the trace 104 may be routed to different layers of the circuit board 12 remote from the mounting pad 102.

The constricted region 94 is provided proximate to the mounting pad 102. For example, the constricted region 94 may be provided in the layer of the circuit board 12 having the corresponding mounting pad 102. The constricted region 94 may also be provided in immediately adjacent layers of the circuit board 12. The constricted region 94 does not extend into all of the layers, but rather only a subset of the layers that surround the mounting pad 102. The constricted region 94 is relatively short as compared to the overall length of the via 54 along a via axis 106. For example, the constricted region 94 may have approximately 10% of the overall length of the via 54, such as in the illustrated embodiment. However, the constricted region 94 may have a different, either longer or shorter, length in alternative embodiments. In an exemplary embodiment, the constricted region 94 has a length less than half of the total length of the via 54. The constricted region 94 may have any shape, including a cylindrical shape as in the illustrated embodiment.

The mounting pad 102 defines an electrical contact portion for electrical connection with a corresponding one of the mounting contacts 30 of the signal terminals 26. In one embodiment, the mounting pad 102 is an enlarged area of the corresponding trace 104, through which the via 54 extends. Optionally, the outer perimeter of the mounting pad 102 may be circular in shape with the via 54 extending through the middle, thus defining a donut shaped mounting pad 102. The mounting pad may be deposited in, or on, one of the layers of the circuit board 12. The mounting pad 102 is at least partially exposed within the via 54. For example, the mounting pad 102 may be exposed by a boring process exposing interior sides 108 of the mounting pad 102, or alternatively, the mounting pad 102 may be exposed by laser drilling to expose a top, bottom and/or internal sides 108 of the mounting pad 102. The mounting pads 102 of some of the vias 54 are located at different depths within the corresponding via 54 relative to the upper surface 86 of the circuit board 12 than the mounting pads 102 of others of the vias 54, such as the embodiment illustrated in FIG. 1. The depth corresponds to the particular layer having the corresponding mounting pad 102.

The upper via 96 is provided proximate to the upper surface 86 and the lower via 98 is provided proximate to the lower surface 88. The upper via 96 is open at a contact reception end for receiving the mounting contact 30 therein. In the illustrated embodiment, the lower via 98 is open at a bottom end opposite the contact reception end of the via 54. However, the via 54 may not extend entirely through the circuit board 12 in some embodiments, thus defining a closed bottom via. The upper via 96 and the lower via 98 are sized larger than the constricted region 94. In an exemplary embodiment, the diameter of the constricted region 94 is approximately half the diameter of the larger diameter portion 96, 98. Having a large diameter for the larger diameter portions 96, 98 introduces air in the vias 54 along the via axes 106 around the signal terminals 26. The air affects interpair and intrapair coupling, such as by lowering cross-talk with neighboring traces 104 and/or raising impedance of the signal terminals 26. In an exemplary embodiment, the larger diameter portions 96 are filled with air, which has a dielectric constant of approximately 1.0, as opposed to the material of the circuit board 12, which may be FR-4 having a dielectric constant of approximately 4.3. The air surrounding the mounting contacts 30 affects the electrical characteristics of the mounting contacts 30, such as by affecting the interactions between the adjacent mounting contacts 30 and/or by affecting the interactions between the mounting contacts 30 and the neighboring traces 104.

The larger diameter portions 96, 98 also provide spacing between the mounting contacts 30 and the via walls 100, such that the mounting contacts 30 do not engage the via walls 100 in the larger diameter portions 96, 98. As such, the mounting contacts 30 may be easier to insert into the vias 54. The mounting contacts 30 do not rub against the via walls 100, which may reduce contact wear and/or reduce the occurrence of buckling or other damage to the mounting contacts 30. The diameter of the larger diameter portions 96, 98 may be restricted by other components of the circuit board 12, such as the proximity of neighboring traces 104 to the vias 54 and/or the spacing between the vias 54 themselves. The diameter of the larger diameter portions 96, 98 may be restricted by a size of one or more opening(s) 114, also known as an antipad, in one or more ground layer(s) 116. The opening 114 and the ground layer 116 are also illustrated in FIG. 3. The ground layer 116 is designed to be a certain distance from the mounting contacts 30 to control impedance.

In an exemplary embodiment, the vias 54 are formed by forming an opening within the circuit board 12 to define the via wall 100 of the smaller diameter portion 94, such as during an initial boring process. The initial boring process bores through the mounting pad 102 to expose the sides 108 of the mounting pad 102. In an exemplary embodiment, the vias 54 are not plated. Thereafter, the upper via 96 is formed from the upper surface 86 down to the vicinity of the mounting pad 102, such as during a counterboring process. The counterboring operation will remove a portion of the circuit board 12 to the counterbored depth. As such, the counterboring process will define an upper shoulder 110 between the smaller diameter portion 94 and the upper larger diameter portion 96 at a top of the smaller diameter portion 94. Similarly, the lower via 98 is formed from the lower surface 88 up to the vicinity of the mounting pad 102, such as during a counterboring process. The counterboring operation will remove a portion of the circuit board 12 to the counterbored depth. As such, the counterboring process will define a lower shoulder 112 between the smaller diameter portion 94 and the lower larger diameter portion 98 at a bottom of the smaller diameter portion 94. Optionally, the upper and lower shoulders 110, 112 may be approximately perpendicular with respect to the via wall 100 of the smaller diameter portion. However, in alternative embodiments, the upper and lower shoulders 110, 112 may be at other angles, such as approximately a 45° angle. The upper and lower shoulders 110, 112 may not be planar, but rather may be curved, which may give the constricted region 94 an hourglass shape. Optionally, the upper and lower shoulders 110, 112 may meet at a point, such as at the mounting pad 102.

When the receptacle connector 16 is mounted on the circuit board 12, the mounting contacts 30 are each received within the corresponding via 54, such that the mounting contacts 30 are electrically connected to the respective mounting pad 102.

The mounting pads 102 themselves are directly engaged by the signal terminals 26, as opposed to having a plated via that is electrically connected to the mounting pad 102, where the signal terminals 26 engage the plated vias. The vias 54 do not include any conductive surfaces that extend longitudinally along the via axes 106 for any amount of length. As such, the vias 54 do not include any areas of low impedance and/or high cross-talk. Some of the mounting contacts 30 of the signal terminals 26 extend different depths, relative to the upper surface 86, into the corresponding via 54 than others of the mounting contacts 30 (whether the others are on the same contact module 22 or a different contact module 22). Although the mounting contacts 30 are shown herein as press-fit contacts, the mounting contacts 30 may each be any suitable type of electrical contact that enables the mounting contacts 30 to function as described herein, such as blade type contacts or other types of contacts.

The mounting contacts 30 include a mounting portion 130 and a transition portion 132. The mounting portion 130 is generally located within the constricted region 94 and the lower via 98, however a segment of the mounting portion 130 may extend into the upper via 96. The mounting portion 130 engages the mounting pad 102 within the corresponding via 54. In the illustrated embodiment, the mounting portion 130 is represented by a press-fit contact, such as an eye-of-the-needle type contact. The press fit contact includes a slit 134 in a portion thereof, with the mounting portion 130 having a bulbous shape around the slit 134. As such, the mounting portion 130 is wider in the vicinity of the slit 134. In an exemplary embodiment, the mounting portion 130 is wider than a diameter of the smaller diameter portion 94 such that the mounting portion is compressed when loaded into the smaller diameter portion 94. For example, the outer portions of the mounting contact around the slit 134 are pressed inward, reducing the size of the slit 134. Such compression causes an interference fit with the smaller diameter portion 94 and the mounting pad 102.

The mounting portion 130 includes a retention barb 140 extending outward therefrom. The retention barb 140 is cantilevered from a shaft or pin 142 of the mounting portion 130. A distal end 144 of the retention barb 140 is upward facing. When assembled, the mounting contact 30 is loaded into the via 54 until the distal end 144 of the retention barb 140 passes into the lower via 98. Once the retention barb 140 clears the lower shoulder 112, the retention barb 140 deflects outward from the shaft 142 into the larger diameter portion 98. The distal end 144 engages the lower shoulder 112 to hold the mounting contact 30 in the via 54. The retention barb 140 thus resists removal of the mounting contact 30 from the via 54. As such, the mounting contact 30 is not allowed to inadvertently back out of the via 54, and the mounting portion 130 thus maintains contact with the mounting pad 102.

In an exemplary embodiment, the mounting contact 30 includes a cap 146 at a top thereof. The cap 146 is configured to engage the upper surface 86 to resist over insertion of the mounting contact 30 into the via 54. The cap 146 is positioned a predetermined distance from the mounting portion 130 corresponding to a depth of the mounting pad 102. As such, the cap 146 ensures that the mounting portion 130 is properly aligned with the mounting pad 102 when the cap 146 is fully seated against the upper surface 86. In the illustrated embodiment, the cap 146 is defined by projections extending radially outward from opposite edges of the mounting contact 30 in opposed directions. The cap 146 may have any shape in alternative embodiments that allow the cap to engage the upper surface 86.

The transition portion 132 is generally located within the upper via 96 and extends between the mounting face 42 and the mounting portion 130. The cap 146 may be provided at a top of the transition portion 132. Optionally, the transition portion 132 may be generally offset with respect to the mounting portion 130, such as described in U.S. Patent Application titled "ELECTRICAL CONNECTOR SYSTEM", 12/729,889, the complete subject matter of which is incorporated by reference herein. The amount of offset is established to control the impedance of the signal terminals 26 and/or cross-talk between the signal terminals 26 and neighboring traces 104. The upper vias 96 provide space for the transition portions 132 to be offset from the via axes 106. However, in alternative embodiments, the transition portion 132 and the mounting portion 130 may be generally coplanar. The amount of offset is established to control the impedance of the mounting contacts 30 and/or cross-talk between the mounting contacts 30 and neighboring traces 104. For example, the transition portions 132 are offset toward one another, such as to decrease impedance of the mounting contacts 30. Optionally, the transition portions 132 may be offset away from the neighboring traces 104, such as to reduce cross-talk between the mounting contacts 30 and the neighboring traces 104.

In an exemplary embodiment, the transition portions 132 may include a folded over portion 148 along at least a portion of the length of the transition portion 132. The folded over portion 148 is defined during a forming process. The folded over portion 148 defines a strengthening rib, and may be referred to hereinafter as a strengthening rib 148. The strengthening rib 148 provides rigidity to the transition portion 132 and helps prevent buckling of the mounting contact 30 during mounting of the receptacle connector 16 to the circuit board 12. Optionally, the strengthening rib 148 may be formed by other methods or processes other than folding over the mounting portion 130, including being a separate piece that is attached to the mounting portion 130. Optionally, a dielectric support collar (not shown) at least partially surrounds the transition portion 132. The support collar supports the transition portion 132, such as to prevent buckling. The support collar may be used in addition to, or in lieu of the folded over portion 148.

Figure 4:
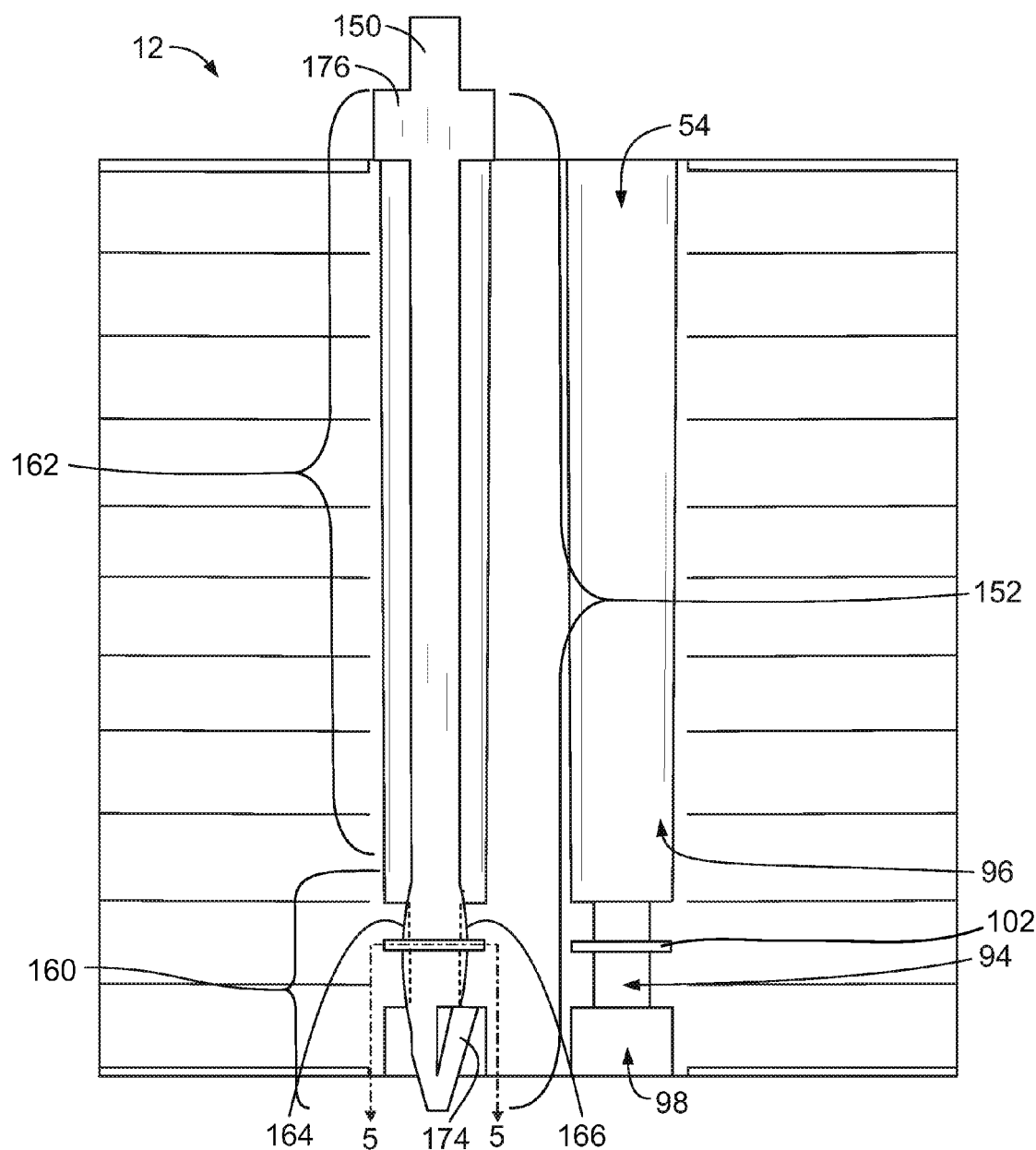
FIG. 4 is a side view of the circuit board and an alternative signal terminal.
Figure 5:
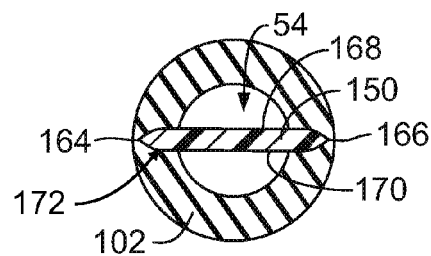
FIG. 5 is a cross-sectional view of the signal terminal taken along line 5-5 in FIG. 4.

FIG. 4 is a side view of the circuit board 12 and an alternative signal terminal 150 for mounting to the mounting pad 102. FIG. 5 is a cross-sectional view of the signal terminal 150 taken along line 5-5 in FIG. 4. The signal terminal 150 includes a mounting contact 152 having a mounting portion 160 and a transition portion 162. The transition portion 162 is generally located within the upper via 96 and extends between the mounting face 42 (shown in FIG. 1) and the mounting portion 160.

The mounting portion 160 engages the mounting pad 102 within the corresponding via 54. In the illustrated embodiment, the mounting portion 160 is represented by a blade type contact having opposite edges 164, 166 that are relatively sharp to define blades. During loading of the mounting contact 152 into the via 54, the edges 164, 166 cut through the circuit board 12 and the mounting pad 102. Optionally, the mounting contact 152 does not cut entirely through the diameter of the mounting pad 102. Opposite sides 168, 170 (shown in FIG. 5) of the mounting portion 160 engage the mounting pad 102, such as in the area designated 172.

The mounting portion 160 may be wider than the transition portion 162. The mounting portion 160 is wider than the diameter of the smaller diameter portion 94.

The mounting portion 160 includes a retention barb 174 extending outward therefrom. The retention barb 174 is similar to the retention barb 140 (shown in FIGS. 2 and 3). Optionally, the mounting contact 152 may include a cap 176 at a top thereof. The cap 176 is similar to the cap 146 (shown in FIGS. 2 and 3).

The embodiments described and/or illustrated herein provide an electrical connector that may enable improvement of the density and/or electrical performance of circuit board footprints to achieve higher system densities and/or higher system speeds. For example, the embodiments described and/ or illustrated herein, when left at the same density as at least some known systems, may decrease via to via coupling and may increase circuit board footprint impedance. Alternatively, the embodiments described and/or illustrated herein may be able to achieve higher footprint densities than at least some known systems while maintaining the same via to via coupling and impedance levels of such known systems. The embodiments described and/or illustrated herein may provide improved electrical characteristics between signal terminals of the electrical connector.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means—plus-function format and are not intended to be interpreted based on 35 U.S.C. §112, sixth paragraph, unless and until such claim limitations expressly use the phrase "means for" followed by a statement of function void of further structure.

What is claimed is:

1. An electrical connector assembly comprising:
a circuit board comprising vias extending at least partially through the circuit board along via axes, the vias being non-plated vias, the circuit board having traces and mounting pads that are electrically connected to corresponding traces, the mounting pads being exposed within corresponding vias, the vias having a staged diameter along the via axis with a constricted region proximate to the mounting pad; and
an electrical connector mounted on the circuit board, the electrical connector comprising a housing and signal terminals held by the housing, the signal terminals comprising mounting contacts configured to be received in respective vias of the circuit board, the mounting contacts engaging the corresponding mounting pads within the constricted region of the via.

2. The assembly of claim 1, wherein the vias are defined by via walls, the via walls being non-cylindrical along the via axes with the via walls being stepped inward to define the constricted region.

3. The assembly of claim 1, wherein the vias are defined by via walls, the via walls being non-cylindrical along the via axes with the via walls defining an upper via above the constricted region having a larger diameter than a diameter at the constricted region, the signal terminals being spaced apart from and not engaging the via walls in the upper via, the signal terminals engaging the via walls and the corresponding mounting pad in the constricted region.

4. The assembly of claim 1, wherein the constricted region defines a smaller diameter portion, the vias including an upper larger diameter portion and a lower larger diameter portion above and below the smaller diameter portion, respectively, an upper shoulder being defined between the upper larger diameter portion and the smaller diameter portion, a lower shoulder being defined between the lower larger diameter portion and the smaller diameter portion, the mounting contacts having a retention barb engaging the lower shoulder to hold the mounting contact within the corresponding via.

5. The assembly of claim 1, wherein the mounting contacts have a cantilevered retention barb, the retention barb engaging the corresponding via to hold the mounting contact within the corresponding via.

6. The assembly of claim 1, wherein the circuit board includes an upper surface, the electrical connector being mounted to the upper surface of the circuit board, the signal terminals each including a cap extending therefrom, the cap engaging the upper surface to limit insertion of the mounting contacts into the corresponding vias.

7. The assembly of claim 1, wherein the mounting contacts include mounting portions having eye-of-the-needle type contacts, the mounting portion pressing against the corresponding mounting pad to make electrical contact with the mounting pad.

8. The assembly of claim 1, wherein the mounting contacts include mounting portions having blade type contacts, the mounting portion slicing through the constricted region and the corresponding mounting pad to make electrical contact with the mounting pad.

9. The assembly of claim 1, wherein the vias are formed by boring through the circuit board and the corresponding mounting pads, the vias being counterbored from an upper surface of the circuit board to a predetermined depth, the constricted region being defined below the predetermined depth of counterboring.

10. The assembly of claim 1, further comprising a strengthening element attached to, or formed integral with, the mounting contact.

11. The assembly of claim 1, wherein the mounting contacts each having a mounting portion engaging the mounting pad within the corresponding via, the mounting contacts each having a transition portion extending between a mounting face of the housing and the mounting portion of the mounting contact, the transition portion being offset with respect to the mounting portion.

12. The assembly of claim 1, wherein the signal terminals constitute variable depth signal terminals being configured to extend different depths into respective vias of the circuit board, the signal terminals being arranged in pairs carrying differential pair signals, the signal terminals of each pair extending to the same depth in the respective vias of the circuit board.

13. The assembly of claim 1, wherein the mounting contacts have opposite sides and opposite edges, the edges piercing the mounting pads such that the sides and edges engage corresponding mounting pads.

14. The assembly of claim 1, wherein the mounting pads are no thicker than the corresponding traces.

15. An electrical connector assembly comprising:

a circuit board comprising vias extending at least partially through the circuit board along via axes, the circuit board having traces and mounting pads that are electrically connected to corresponding traces, the mounting pads being arranged at a depth below an upper surface of the circuit board and being exposed within corresponding vias, the vias having a smaller diameter portion proximate to the mounting pad and the vias having an upper larger diameter portion and a lower larger diameter portion above and below the smaller diameter portion, respectively, an upper shoulder being defined between the upper larger diameter portion and the smaller diameter portion, a lower shoulder being defined between the lower larger diameter portion and the smaller diameter portion; and an electrical connector mounted on the circuit board, the electrical connector comprising a housing and signal terminals held by the housing, the signal terminals comprising mounting contacts being received in respective vias of the circuit board, the mounting contacts engaging the corresponding mounting pads, the mounting contacts having a retention barb engaging the lower shoulder to hold the mounting contact within the corresponding via.

16. The assembly of claim 15, wherein the vias are defined by via walls, the via walls being non-cylindrical along the via axes with the via walls being stepped inward to define the smaller diameter portion.

17. The assembly of claim 15, wherein the signal terminals are spaced apart from and do not engage the via walls in the larger diameter portions, the signal terminals engaging the via walls and the corresponding mounting pad in the smaller diameter portion.

18. The assembly of claim 15, wherein the retention barb is cantilevered from a shaft of the mounting contact to a distal end, the distal end being upward facing to engage the lower shoulder.

19. An electrical connector for mounting on a circuit board having vias with mounting pads exposed within corresponding vias, the electrical connector comprising:

a housing having a mounting face configured to be mounted along the circuit board; and signal terminals held by the housing, the signal terminals being configured to extend into respective vias of the circuit board, the signal terminals comprising mounting contacts extending outward from the mounting face of the housing, the mounting contacts being configured to engage corresponding mounting pads in the vias, the mounting contacts having retention barbs extending outward therefrom being configured to engage the vias to hold the mounting contacts within the corresponding vias.

20. The electrical connector of claim 19, wherein the retention barb is cantilevered from a shaft of the mounting contact to a distal end, the distal end being upward facing to engage the lower shoulder.

21. The electrical connector of claim 19, wherein the mounting contacts include mounting portions having eye-of-the-needle type contacts, the mounting portion pressing against the corresponding mounting pad to make electrical contact with the mounting pad.

* * * * *